US006808647B1

(12) United States Patent
Xu et al.

(10) Patent No.: US 6,808,647 B1
(45) Date of Patent: Oct. 26, 2004

(54) METHODOLOGIES TO REDUCE PROCESS SENSITIVITY TO THE CHAMBER CONDITION

(76) Inventors: Songlin Xu, 41641 Denise St., Fremont, CA (US) 94539; Zhiwen Sun, 126 Destry Ct., San Jose, CA (US) 95136; Dragan Podlesnik, 1736 Oak Creek Dr., Palo Alto, CA (US) 94304; Xueyu Qian, 15300 Skyview Dr., San Jose, CA (US) 95132

(*) Notice: Subject to any disclaimer, the term of this patent is extended or adjusted under 35 U.S.C. 154(b) by 0 days.

(21) Appl. No.: 09/352,008

(22) Filed: Jul. 12, 1999

(51) Int. Cl.[7] ................. B44C 1/22; H01F 21/302; C25F 5/00
(52) U.S. Cl. ............... 216/62; 216/63; 438/714; 134/1.1; 134/1.2; 134/21; 134/22.11
(58) Field of Search ............... 134/1.1, 1.2, 21, 134/22.11; 216/62, 63; 438/710–714

(56) References Cited

U.S. PATENT DOCUMENTS

| 5,242,536 A | 9/1993 | Schoenborn ............... 438/714 |
| 5,256,245 A | 10/1993 | Keller et al. ............... 438/714 |
| 5,332,468 A | 7/1994 | Engelhardt ................. 216/71 |
| 5,453,156 A | 9/1995 | Cher et al. ................. 438/695 |
| 5,756,400 A | * 5/1998 | Ye et al. ................... 438/710 |
| 5,880,033 A | 3/1999 | Tsai ........................ 438/710 |
| 6,136,211 A | * 10/2000 | Qian et al. ................. 216/37 |

FOREIGN PATENT DOCUMENTS

| JP | 05308063 | 11/1993 |
| JP | 07-201814 | * 8/1995 |

OTHER PUBLICATIONS

PCT Written Opinion from PCT/US00/19152, Dated Sep. 13, 2001.
PCT International Search Report dated Feb. 28, 2001.

"Role of the chamber wall in low–pressure high–density etching plasmas", O'Neill, J., et al., Semi–conductor Research and Development Center, IBM Microelectronics Division, New York, 1994, pp. 497–504.

"Behavior of F Atoms and $CF_2$ Radicals in Fluorocarbon Plasmas for $SiO_2$/Si Etching", Tachibana, K. et al., Depart. of Electronics Science and Engineering, Kyoto University, Japan, 1999, pp. 4367–4372.

"Influence of reactor wall conditions on etch processes in inductively coupled fluorocarbon plasmas", Schaepkens, M., et al., Depart. of Physics, University of Albany, New York, 1998, pp. 2099–2107.

* cited by examiner

Primary Examiner—George A. Goudreau
(74) Attorney, Agent, or Firm—Moser, Patterson & Sheridan, L.L.P.; Joseph Bach

(57) ABSTRACT

A method and apparatus for reducing the sensitivity of semiconductor processing to chamber conditions is provided. Process repeatability of common processes are affected by changing surface conditions which alter the recombination rates of processing chemicals to the chamber surfaces. In one aspect of the invention, a composition of one or more etchants is selected to optimize the etch performance and reduce deposition on chamber surfaces. The one or more etchants are selected to minimize buildup on the chamber surfaces, thereby controlling the chamber surface condition to minimize changes in etch rates due to differing recombination rates of free radicals with different surface conditions and achieve etch repeatability. In another embodiment, the etchant chemistry is adjusted to reduce the change to internal surface conditions after a cleaning cycle. In another embodiment, a process recipe is selected to reduce the sensitivity of the etch process to the chamber conditions. In another embodiment, chamber surface materials are selected to minimize the differences in recombination rates of free radicals on the surface materials and the byproduct depositions formed on the materials during processing.

7 Claims, 6 Drawing Sheets

METHODOLOGIES TO REDUCE PROCESS SENSITIVITY TO THE CHAMBER CONDITION

BACKGROUND OF THE INVENTION

1. Field of the Invention

The present invention relates to an apparatus and method for plasma processing. More particularly, the invention relates to methods and apparatus for minimizing process sensitivity to chamber conditions during etching processes.

2. Background of the Related Art

In the fabrication of integrated circuits and other electronic devices, multiple layers of conducting, semiconducting and dielectric materials are deposited and removed from a substrate during the fabrication process. Substrate etching methods and apparatus used in device manufacture for the purpose of removing material from the substrate are well known. Typical etching techniques include wet and dry etching. However, wet etching is typically limited to fabrication of components with lateral dimensions of a micron or greater. Solid state devices and integrated circuits are now routinely fabricated with sub-micron or even nanometer scale components. Therefore, dry etching is now the preferred etching method.

One dry etching technique is commonly known as plasma enhanced etching ("plasma etching"). Plasma etching is very well suited for the manufacture of nanometer sized devices. A conventional plasma etching reactor includes a reactor chamber and an apparatus for producing a plasma within the reactor chamber. The plasma may be produced inductively, e.g., using an inductive RF coil, and/or capacitively, e.g., using a parallel plate glow discharge reactor. Typically, the plasma is struck and maintained both capacitively and inductively.

In general, plasma etching involves positioning a mask on an upper substrate surface to define an exposed portion of the substrate to be etched. The substrate, or batch of substrates, is then placed in the reactor chamber. Etching gases are introduced into the reactor chamber and a plasma is struck. During processing, the reactive species in the plasma etch the exposed portion of the metal, dielectric, or semiconductive material by contacting the exposed portion of the substrate.

At the molecular level, the etch process is a reaction between the reactive species in the plasma and the exposed surface layers of the substrate. The species include free radicals, ions and other particles. Although the reaction between the substrate and the free radicals is essentially chemical in nature, it is greatly enhanced with the ion bombardment which contributes to the etching and provides activation energy to the surface reaction. The reaction between the plasma and a substrate yields etch byproducts, i.e., small volatile molecules that desorb from the surface and subsequently are diffused into the reactor chamber. Most of the volatile byproducts are then pumped out of the reactor chamber.

Etching of a single layer of material generally comprises two primary steps: a main etch process and an overetch process. The main etch process removes the bulk of the material from the exposed substrate surface to form the desired feature. The overetch process is needed in order to remove residual material from the substrate while avoiding undercutting (i.e., isotropic etching) and excessive loss of selectivity between interfacing layers, such as a polysilicon/oxide interface. The chemistry and process parameters for each step are selected to achieve anisotropy, constant, and preferably high, etching rates, uniformity, high selectivity, and reproducibility.

Successful etching requires a controlled process to ensure uniform etching at a controlled and constant rate with respect to each individual substrate as well as from one substrate to the next. Uncontrolled changes in etching rates can lead to changes in device geometries and dimensions. Preferably, an etch rate change for a particular substrate and from one substrate to the next is less than about 10%.

Process stability is affected by various methods and techniques commonly used in the industry. For example, a substantial change in the etch rate is observed after a cleaning process. Cleaning processes are periodically necessary to remove deposits of byproducts which form on the internal chamber surfaces during processing. Most volatile byproducts formed during etching are pumped out of the chamber. However, the byproducts can often react with various gas components used in silicon etching with a halogen plasma, such as oxygen additives, to form less volatile byproducts. In other cases, the byproducts themselves can be less volatile, depending on the material being etched and the etch chemistry. These less volatile species can deposit onto the chamber walls and other exposed surfaces enclosed within the chamber. Over time, the deposits can delaminate and flake off of the chamber surfaces creating a major source of particulate contamination. The particulate often become lodged in the mask or on the substrate surface and produce defective devices. As the size of the etched features become smaller, the effects of particulate become more pronounced.

Thus, in order to control the contamination buildup, the chamber surfaces are cleaned periodically. One method of cleaning a chamber, known as dry cleaning, involves placing a dummy substrate in the chamber and then igniting a plasma The plasma chemistry is selected to react both chemically and physically with the deposits on the chamber, thereby causing the deposits to form byproducts which can be pumped out of the chamber. However, a problem associated with chamber cleaning, is that the etching rates of the subsequent processes are adversely affected. In typical silicon plasma etching, etch rate drops in excess of 33% have been experienced following a chamber cleaning run. Changes in the etch rate are undesirable because of the resulting loss of process reproducibility, or repeatability. Because etching processes are often timed according to pre-programmed recipes, the fluctuation in etch rates results in over-etched or under-etched substrates. Consequently, repeatability between substrates is lost.

In order to minimize the detrimental effects of etch rate variation after a cleaning process, current practice employs a seasoning cycle during which the chamber is conditioned following a cleaning run. Seasoning refers to the operation of the chamber to allow deposition of a film on the chamber surfaces. During a recovery period a seasoning coating is allowed to form on the chamber surfaces by striking a plasma in the chamber and depositing a film on the internal exposed surfaces in the chamber. The chamber seasoning is continued until the pre-clean etch rate is completely recovered. The recovery period is time consuming and non-productive because no substrates are processed. Thus, the throughput of the system is significantly reduced.

Another problem related to process stability occurs when high concentrations of corrosive chemicals are used. For example, a problem exists in cases where fluorine is the major etchant, such as in planarization and recess-etching. Fluorine is a highly corrosive etchant that attacks the chamber surfaces causing a change in the topography of the surface and/or resulting in deposition of a byproduct, such as $AlF_x$ in the case of an $Al_2O_3$ chamber surface. Unlike deposition of $SiO_x$ which can be removed by non-intrusive cleaning methods such as plasma cleaning, as described above, the effects of fluorine etching must be treated by opening the chamber and refinishing the chamber surfaces. Thus, throughput is substantially affected. Additionally, following the cleaning process, fluctuations in the etch rate are observed which inhibit etch rate stability.

Sensitivity to chamber conditions was also observed by the inventors in situations other than post-cleaning. For example, when the same chamber is used to run different applications involving alternating chemistry, varying etch rates are observed. Thus, processes alternating between fluorine-based chemistry and non-fluorine-based chemistry experience volatility in etch rates between each cycle. As an example, a chamber may first be used to process a number of substrates during a fluorine-based process such as a hardmask open or recess etching. Subsequently, the chamber may be used to run a second process not involving the use of fluorine, such as capacitor etching. For reasons heretofore not understood, the etch rates under such conditions experience fluctuation leading to loss of process repeatability.

Therefore, there is a need for reducing the process sensitivity of a processing chamber to the chamber surface conditions.

SUMMARY OF THE INVENTION

The present invention generally provides a method and apparatus of minimizing etch process sensitivity to chamber conditions. The etch process sensitivity can be controlled by various methods including changing the etch chemistry, process parameters and/or changing the chamber materials.

In one aspect of the invention, a composition of one or more etchants is selected to optimize the etch performance and reduce deposition on chamber surfaces. The one or more etchants are selected to minimize buildup on the chamber surfaces, thereby controlling the chamber surface condition to minimize changes in etch rates due to differing recombination rates of free radicals with different surface conditions, thereby allowing etch repeatability. In one embodiment, at least one etchant is introduced into the chamber and a plasma is struck to form at least a first free radical density from the first etchant. The etchant is selected to minimize the rate at which the free radical density reacts to produce deposition on the internal surfaces of the chamber and wherein the recombination rate of the free radical density on the deposition formed on the internal surfaces is substantially different than the recombination rate of the free radical density on the internal surface. In another embodiment, chlorine and bromine are introduced into a chamber at a first and a second flow rate, respectively; wherein the first flow rate is higher than the second flow rate. Preferably, the ratio of chlorine to bromine is greater than about 3:1.

In another aspect of the invention, a first and second etchant are flowed into an etch chamber wherein the first etchant is adapted to clean the internal surfaces of the chamber and prevent the deposition of byproducts thereon while simultaneously etching a substrate. A substantially constant chamber surface profile is maintained in order to maintain a substantially constant recombination rate of plasma constituents with the chamber surfaces. Preferably, the first etchant is a fluorine-containing fluid and the second etchant is preferably a halogen, such as chlorine or bromine.

In yet another aspect of the invention an etch chemistry is selected to minimize corrosion of a chamber surface. A first etchant having corrosive properties is diluted with a second etchant wherein the second etchant is preferably non-corrosive or less corrosive than the first etchant. The first etchant is a fluid exhibiting corrosive effects when brought into contact with an internal chamber surface. The second etchant is combined with the first etchant to reduce the corrosive effects of the first etchant on chamber surfaces. The resulting mixture preferably exhibits reduced corrosive effects on chamber surfaces and allows successive processing of multiple substrates under substantially similar chamber surface conditions. In one embodiment, the first etchant is a fluorine-containing fluid such as $CF_4$, $SF_6$ or $NF_3$. The second etchant is preferably a chlorine-containing fluid such as $Cl_2$.

In yet another aspect of the invention, a chamber pressure is controlled to reduce the sensitivity of an etch process to the chamber surface conditions. The chamber pressure is controlled during an overetch process to increase the ratio of ions to free radicals, thereby increasing ion-assisted etching and reducing pure free radical etching. In one embodiment, the pressure during an overetch of a polysilicon layer is preferably less than about 30 mTorr. The etch process is preferably bromine-based or chlorine-based.

In yet another aspect of the invention, the chamber pressure and the concentration of oxygen in the chamber is controlled to reduce the sensitivity of an etch process to the chamber surface conditions. The chamber pressure is controlled during an overetch process to increase the ratio of ions to free radicals, thereby increasing ion-assisted etching and reducing free radical etching. The oxygen concentration is controlled to reduce oxidation of a substrate surface being etched. In one embodiment, the pressure during an overetch of a polysilicon layer is preferably less than about 10 mTorr and the oxygen concentration is less than about 25% of the total flow volume of gases into the chamber. The etch process is preferably bromine-based or chlorine-based.

In yet another aspect of the invention, the chamber pressure, the concentration of oxygen in the chamber, and the source power is controlled to reduce the sensitivity of an etch process to the chamber surface conditions. The chamber pressure is controlled to increase the ratio of ions to free radicals, thereby increasing ion-assisted etching and reducing free radical etching. The oxygen concentration is controlled to reduce oxidation of a substrate surface being etched. The source power delivered to an inductive coil is adjusted to control substrate surface oxidation and etching. In one embodiment, the pressure during an overetch process of a polysilicon layer is preferably less than about 10 mTorr, the oxygen concentration is less than about 25% of the total flow volume of gases into the chamber and the source power is between about 100–500W. Preferably, the oxygen concentration and the source power are inversely adjusted, such that when the oxygen concentration is increased, the source power is decreased and vice versa. The etch process is preferably bromine-based or chlorine-based.

In still another aspect of the invention, the chamber materials are selected to reduce the sensitivity of an etch process to the chamber surface conditions. The materials are selected according to the recombination rate of free radicals therewith. Preferably, the recombination rate of the free radicals with the selected materials is substantially equal to the recombination rate of the free radicals with the byproducts formed during the etch process and deposited on the chamber surfaces. Thus, the etch rate is substantially constant over time even where deposits are formed on the chamber surfaces. In one embodiment, the chamber components exposed to the processing environment of a silicon etch chamber, such as the chamber body and the chamber dome/lid, substantially comprise quartz. The chamber components may be constructed of quartz or, alternatively, may be lined with quartz.

In still another aspect of the invention, the chamber temperature is controlled to reduce the sensitivity of an etch process to the chamber surface conditions. The temperature is preferably sufficiently high to reduce deposition on exposed chamber surfaces. In one embodiment, a polysilicon layer is etched at a chamber temperature of at least about 200° C.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

The present invention generally relates to methods of minimizing etch process sensitivity to chamber conditions. The etch process sensitivity can be controlled by various methods including changing the etch chemistry and/or process parameters and changing the chamber materials.

For clarity and ease of description, the following description refers primarily to a silicon etch system and the processes performed therein, including polysilicon etching. However, the invention is equally applicable to other types of processes that utilize chemicals to deposit or etch materials on or from a substrate and which are responsive to changing surface conditions. For example, chemical vapor deposition (CVD) processes may use the present invention to advantage.

Figure 1:
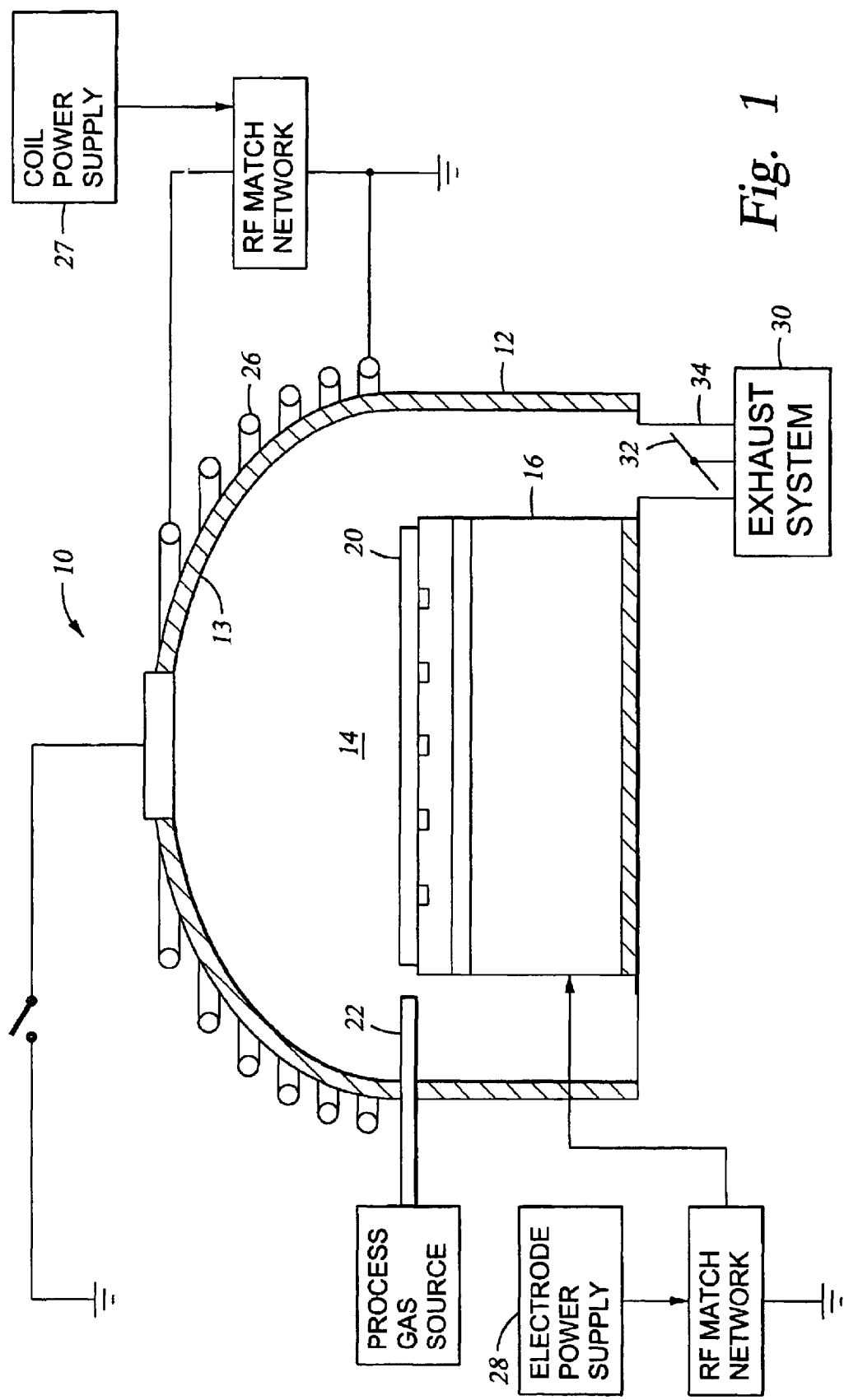
FIG. 1 is a schematic view of an etching chamber.

One chamber 10 which may be used to advantage with the present invention is schematically illustrated in FIG. 1. The chamber 10 includes a body 12 preferably made of a metal, such as anodized aluminum, and a dome ceiling 13 preferably made of a dielectric, such as ceramic. The chamber 10 defines a plasma zone 14 having a support member 16 disposed therein. The support member 16 may by a mechanical or electrostatic chuck with grooves in which a coolant gas, such as helium, is held to control the temperature of the substrate 20 disposed on the support member 16 during processing. At least a portion of the support member 16 is electrically conductive and serves as a process cathode. The support member 16 cooperates with the electrically grounded body 12, which serves as an anode, to form process electrodes in the plasma zone 14.

Process gas is introduced into the chamber 10 through a gas distributor 22 peripherally disposed about the support member 16. A plasma is formed from the process gas using a plasma generator that couples an electromagnetic field into the plasma zone 14. The plasma generator can comprise an inductor coil 26 disposed adjacent to the dome ceiling 13 of the process chamber 10. Preferably, the inductor coil 26 is wrapped around the dome ceiling 13 and is capable of forming an inductive electric field in the chamber when powered by a coil power supply 27

In addition to the inductor coil 26, the support member 16 is powered by an electrode power supply 28 to generate a capacitive electric field in the process chamber 10. Typically an RF voltage is applied to the support member 16 while the body 12 is electrically grounded. The capacitive electric field is perpendicular to the plane of the support member 16, and accelerates inductively formed plasma species toward the substrate 20 to provide more vertically oriented anisotropic etching of the substrate 20.

Spent process gas and etchant byproducts are exhausted from the process chamber 10 through an exhaust system 30. A throttle valve 32 is provided in an exhaust port 34 for controlling the pressure in the chamber 10. Also, an optical endpoint measurement technique may be used to determine completion of the etching process for a specific layer by measuring the change in light emission of a particular wavelength corresponding to a detectable gaseous species. A sudden decrease or increase in the amount of the detectable species indicates completion of etching of one layer and the start of etching of another layer.

The processes described below were carried out in a chamber such as the one described above with reference to FIG. 1. However, the particular processing chamber used is not limiting of the present invention. Other chambers may be used to advantage.

As described above, process stability is desired during etching in order to ensure repeatability of etch results. Further, it was noted above that various common procedures used in etch chambers, such as chamber cleaning, resulted in unacceptable levels of etch rate changes. The inventors have discovered that process stability is dependent upon passive chamber conditions such as the chamber wall surface condition. Frequently, these chamber conditions are altered without regard for, or awareness of, the resulting impact on the subsequent ething processes.

The inventors postulate that at least one cause of the fluctuation in etch rates is attributed to the different recombination rates of reactive free radicals on different chamber surfaces. For example, in the case of silicon etching, a byproduct identified as a $SiO_x$ (where x=1–2) compound is deposited on the internal chamber surfaces. After a cleaning cycle, the byproduct is removed and the underlying chamber surfaces are revealed. Where the recombination rates of radicals with the byproducts is lower than the recombination rates of radicals with typical chamber materials, such as ceramic and anodized aluminum, the free radical density in the plasma increases as the chamber surfaces are covered with the byproducts. Thus, when the chamber surfaces are free of deposition, such as immediately following a cleaning cycle, the free radicals recombine with the chamber surfaces at a first rate. Over a period of time, a layer of byproducts is formed on the chamber surfaces resulting in a second recombination rate of the free radicals with the chamber surfaces wherein the second rate is less than the first rate. Once the thickness of byproduct deposition exceeds an acceptable level, the chamber is cleaned to again expose the underlying chamber surfaces, thereby resulting in the first recombination rate of free radicals for subsequent processes. Using optical actinometry, the inventors observed a 50%–70% decrease in the free radical density in Cl-based and Br-based etching following a cleaning run. The varying recombination rates result in fluctuating radical densities in the plasma available for etching a substrate and the etch rate is varied over time as a function of the chamber surface composition and condition.

In general, for polysilicon etch processes, the etch rate is increased as deposits such as $SiO_x$ (where x=1–2) are formed on the chamber surfaces. However, any change in the etch rate which significantly impairs the consistency and repeatability of an etch process is considered detrimental. The effects of varying free radical densities are particularly detrimental in cases where the process involves reactions dominated by free radical concentrations such as the overetch process in an etch process. As noted above, the overetch process is a process where residual material from the substrate is selectively removed to form the features of a substrate under highly controlled conditions.

In one embodiment of the invention, the etch chemistry is adjusted to minimize deposition of byproducts on the chamber surfaces when the recombination rate of radicals with the material deposited on the chamber surfaces is substantially different from the recombination rate with the chamber surface material. A primary etchant is selected according to the etchant's potential to deposit byproducts on chamber surfaces. The primary etchant is defined as the etchant having the highest volumetric flow relative to each of the individual constituents of the chemical mixture flowed into the chamber and may be the only etchant used in some cases. Preferably, the primary etchant is selected to minimize the formation of byproducts that are deposited on chamber surfaces.

One example of the present invention is illustrated with reference to Tables I and II. Table I shows a conventional "baseline" process recipe for a main etch process and an overetch process of silicon. The main etch process consists of halogens, such as Cl and Br mixtures, with proportionately higher Br content. The overetch process consists of Br-based chemistry and is performed at higher pressures relative to the main etch process. The use of Br-containing plasmas for the main etch process as well as the overetch process provides high selectivity anisotropic poly etch. Compared to Cl, Br is found to increase the poly:oxide selectivity and allow greater control of the etching profile. The process parameters given in Table I are typical for etching a polysilicon layer on a substrate.

TABLE I

| Parameter | Main Etch | Overetch |
|---|---|---|
| Composition: | $Cl_2$, HBr (1 Cl:2 Br), $O_2$ (<5% by volume) | HBr $O_2$ (<3% by volume) |
| Flow rate: | 200 sccm | 155–460 sccm |
| Coil Power: | 500 W | 500–1000 W |
| Bias Power: | 80 W | 100–150 W |
| Pressure: | 4 mTorr | 50 mTorr |
| Temperature: | 50° C. | 50° C. |

Figure 2:
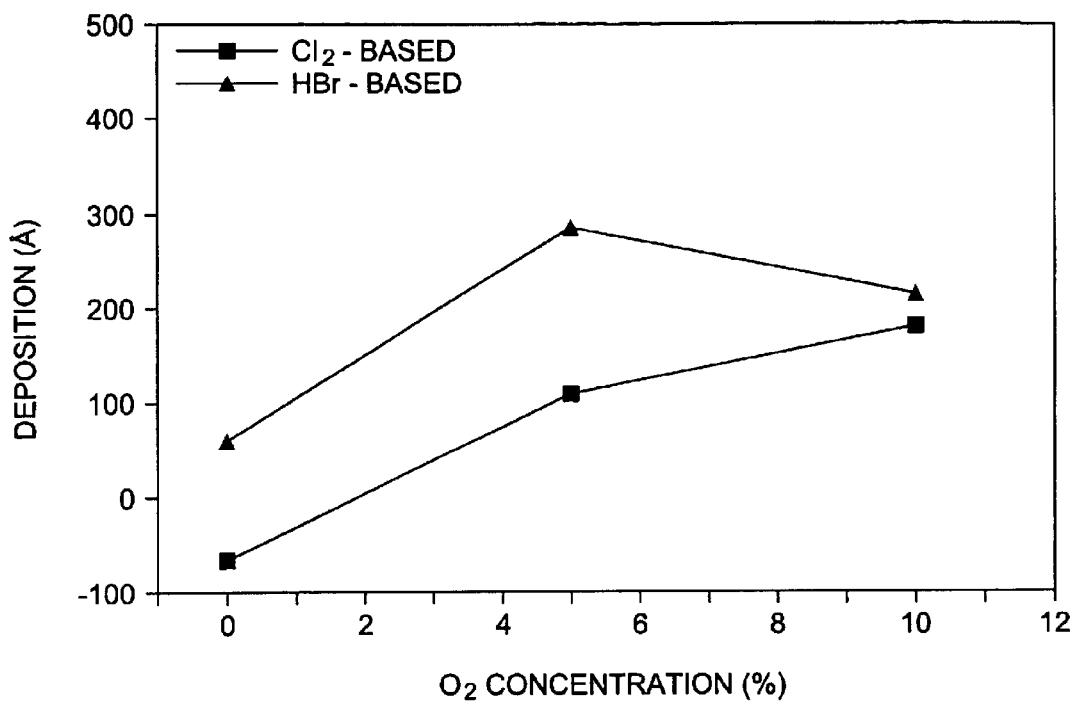
FIG. 2 is a graphical representation of the deposition rates of etchants as a function of oxygen.

The inventors have determined that, contrary to the trend and common expectations, higher proportions of Cl minimize the detrimental effects of changing chamber surface conditions, such as the rate variation in overetch where the etching is dominated by free radicals. FIG. 2 is a comparative graph showing a deposition curve for HBr etching and a deposition curve for $Cl_2$ etching of 3000 Å of polysilicon. The curves plot the deposition thickness of $SiO_x$ (where x=1–2) on a chamber surface in changing $O_2$ concentrations. The parameters for both curves were substantially the same and are as follows. $Cl_2$-based: 50° C., 100 sccm ($Cl_2$ and $O_2$) 3 mTorr, 400W (coil), 60W (bias). HBr-based: 50° C., 100 sccm (HBr and $O_2$), 6 mTorr, 400W (coil), 60W (bias).

FIG. 2 indicates that the use of Br-based chemicals, such as HBr, result in higher levels of deposits in the chamber as compared to deposits resulting from Cl-based chemicals, such as $Cl_2$. This result is attributed to the fact that during poly etching, SiCl and SiBr compounds are formed. SiCl is volatile and is pumped out of the chamber. SiBr, however, is less volatile and reacts with the $O_2$ to produce $SiO_x$ compounds that are deposited onto the chamber surfaces.

As described above, the density of free radicals in the plasma is directly related to the chamber surface condition. Because the recombination rates of radicals with $SiO_x$ is lower than the recombination rates of radicals with typical chamber materials, such as ceramic and anodized aluminum, the free radical density in the plasma increases as the chamber surfaces are covered with $SiO_x$. Thus, as the chamber surface condition changes over time, the etch rate changes accordingly. Specifically, because the free radicals contribute to the etching of the polysilicon, the etch increases with increasing deposits on the chamber surfaces. Such variation in the etch rate is undesirable because etch repeatability is compromised. The free radical density is particularly important during processes which are chemical in nature, such as the overetch process, and conventionally rely on high concentrations of radicals to maintain a desired etch rate. A change in the density of free radicals results in varying overetch rates, and consequently a loss of repeatability. Thus, successful etching requires the etch rate to be controlled and to be substantially constant over time.

The inventors have determined that adjusting the etch chemistry to consist of higher proportions of Cl relative to Br can reduce deposition of $SiO_x$, compounds on chamber surfaces during etching. Minimizing the deposit buildup on the chamber surfaces results in a substantially constant density of free radicals in the etching plasma and, therefore, a substantially constant etch rate.

Table II shows a process recipe according to the present invention.

TABLE II

| Parameter | Main Etch | Overetch |
| --- | --- | --- |
| Composition: | $Cl_2$, HBr (1 Cl:2 Br), $O_2$ (<5% by volume) | HBr, $O_2$ (<3% by volume) |
| Flow rate: | 100–200 sccm | 100–200 sccm |
| Coil Power: | 300–500 W | 300–500 W |
| Bias Power: | 80 W | 100 W |
| Pressure: | 4 mTorr | 50 mTorr |
| Temperature: | 10–30° C. | 10–30° C. |

Comparison of Table I and Table II reveals a marked departure from conventional recipes. The process recipe of the invention preferably comprises a Cl:Br ratio between about 3:1 and 5:1. Most preferably, the ratio of Cl:Br is about 4:1, as shown in Table II.

The process according to Table I leads to substantial deposition on the internal chamber surfaces over a short period time. The deposition rate of $SiO_x$, compounds was measured as 50–100 Å/min. In contrast, the process recipe of Table II resulted in a deposition rate of only 10–30 Å/min. The reduced deposition rate is attributed to the higher proportions of Cl relative to Br.

While Br is the primary etchant used during the overetch process in Table II, the resulting byproduct deposition on chamber surfaces is negligible. The overetch process serves only to remove residual material from the device features substantially formed during the main etch process. Thus, the undesirable chamber surface deposition is formed primarily during the main etch process while the overetch process contributes only negligible amounts of deposits on the chamber surfaces.

However, Cl and Br-based etching is merely one example of processes which may be used to advantage according to the invention. The invention is applicable in any plasma process resulting in deposition of byproducts on chamber surfaces which effects a change in the recombination rate of free radicals. Such processes include plasma enhanced chemical vapor deposition, for example. Further, although the foregoing description with reference to Tables I and II illustrates the impact of a silicon main etch on an overetch, the invention contemplates application to any step or steps which alter the chamber surface conditions.

In addition to the etch chemistry, the process parameters, such as pressure, also impact the etch rate. Referring again to Table I, the processing pressure in the baseline overetch recipe is 50 mTorr. Conventionally, process pressures in the overetch process are 50 mTorr or higher because higher pressures afford higher poly:oxide selectivity. At pressures of 50 mTorr and higher, etching is typically more chemical in nature because the radical-to-ion ratio is higher as compared to lower pressures. As the pressure decreases, the radical-to-ion ratio also decreases resulting in an ion dominant, or ion-assisted, etching. Ion-assisted etching refers to etching done by free radicals wherein ion bombardment contributes to the activation energy of the surface reaction. Ion-assisted etching reduces the sensitivity of the etch process to the free radical density, thereby reducing the etch sensitivity to free radical density fluctuations with changing chamber wall conditions.

Figure 3:
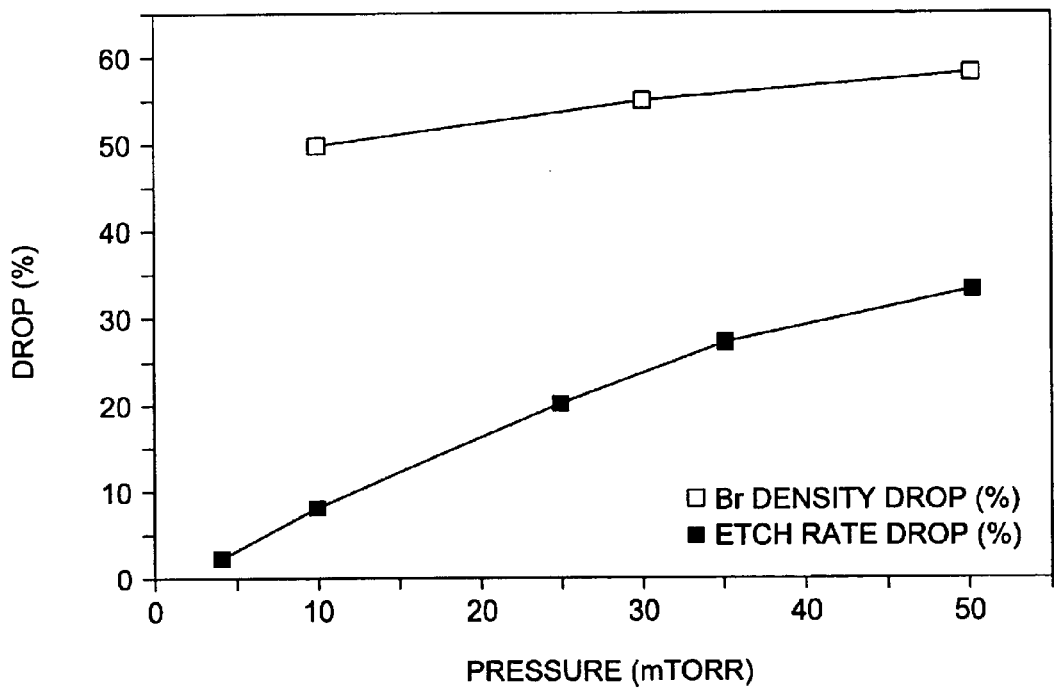
FIG. 3 is a graphical representation of an etch rate drop and free radical density drop as a function of pressure for HBr-based etching.
Figure 4:
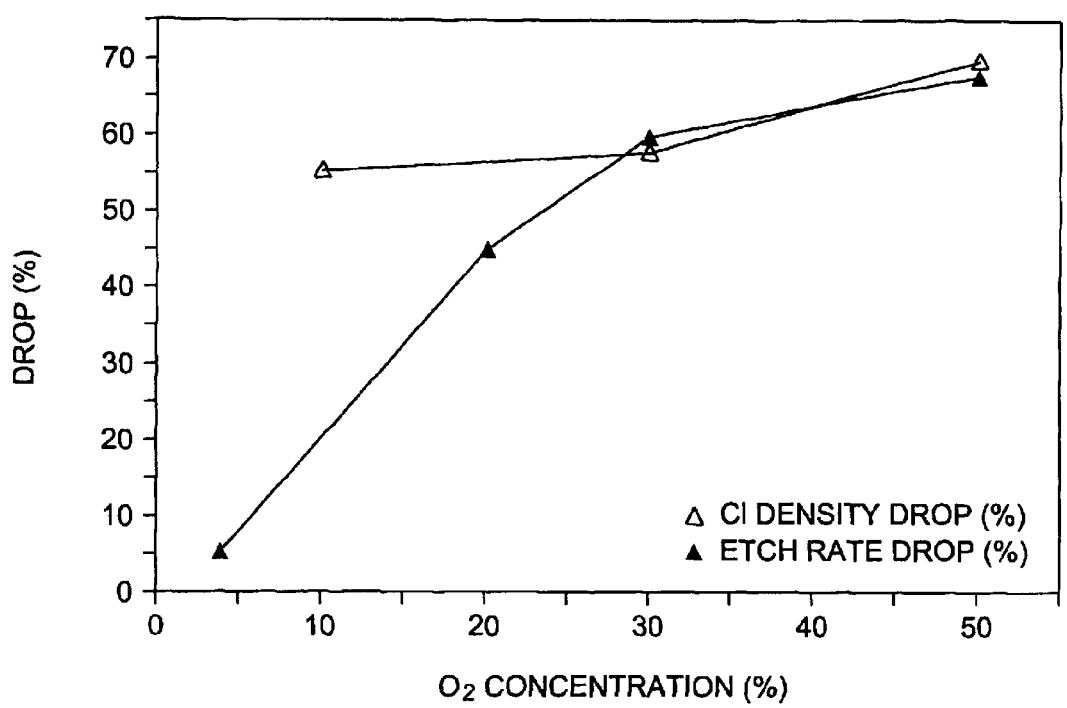
FIG. 4 is a graphical representation of an etch rate drop and free radical density drop as a function of pressure for $Cl_2$-based etching.

FIG. 3 shows the overetch rate drop and free radical density drop as a function of pressure for Br-based etching. The etch rate/density drop is calculated as the percentage decrease in the overetch rate/density after a dry clean process as compared to the overetch rate/density prior to the dry clean process wherein the chamber surfaces had accumulated buildup. The process recipe for the overetch of FIG. 3 was as follows: 150 sccm HBr and 10 $HeO_2$ sccm, 50° C., 100W (source power), 100W (bias power). At a pressure of about 4 mTorr the corresponding etch rate drop is only about 1% and the Br density drop is about 50%. As the pressure is increased, the etch rate drop and the density drop also increase. At a pressure of about 50 mTorr, the etch rate drop is about 33% and the free radical density drop is about 58%. FIG. 4 shows an etch rate drop and free radical density as a function of pressure for $Cl_2$-based etching. Again, at increasing pressures the etch rate drop and the density drop both increase with increasing pressure as the etching becomes more dependent on free radicals.

The inventors postulate the substantial etch rate drop at higher pressures is is due to the recombination rates of radicals with the internal chamber surfaces. After a cleaning process, the recombination rate of the radicals with the chamber surfaces is higher than during pre-cleaning processes wherein the underlying chamber surfaces are covered by deposits. As a result of the cleaning, the underlying chamber surfaces are exposed. Because the recombination rate of free radicals with the underlying chamber surfaces is higher than the recombination rate with the chamber deposits, the density of available radicals in the plasma is reduced resulting in an etch rate drop in process steps relying on high concentrations of radicals, such as the overetch process. However, at lower pressures the etching becomes ion dominated and the chemical etching due to free radicals is reduced. Decreasing the pressure decreases the free radical to ion ratio, thereby increasing the ion etching and decreasing the free radical etching. As a result, the process becomes less dependent on the free radical density.

Thus, the effects of cleaning a chamber on the overetch process can be mitigated according to the low pressure processing of the present invention. In a preferred embodiment, the overetch process recipe for polysilicon comprises a pressure of less than about 30 mTorr and most preferably comprises a pressure of about 10 mTorr. The pressure may be optimized for a particular etch chemistry and process parameters. Preferably, the etch rate change after a cleaning process is less than about 10%. Thus, contrary to conventional practice, the invention provides a low pressure method of overetching to minimize the effects of the chamber wall condition. This solution is counter-intuitive because the selectivity is sacrificed as the pressure is lowered. However, selectivity at the lower pressures of the present invention may be increased by controlling other process parameters. For example, the bias power may be decreased to lessen the rate at which ions etch the substrate. Further, the oxygen flow rate may be increased to increase oxidation of the substrate surface, thereby decreasing the etch rate.

Figure 5:
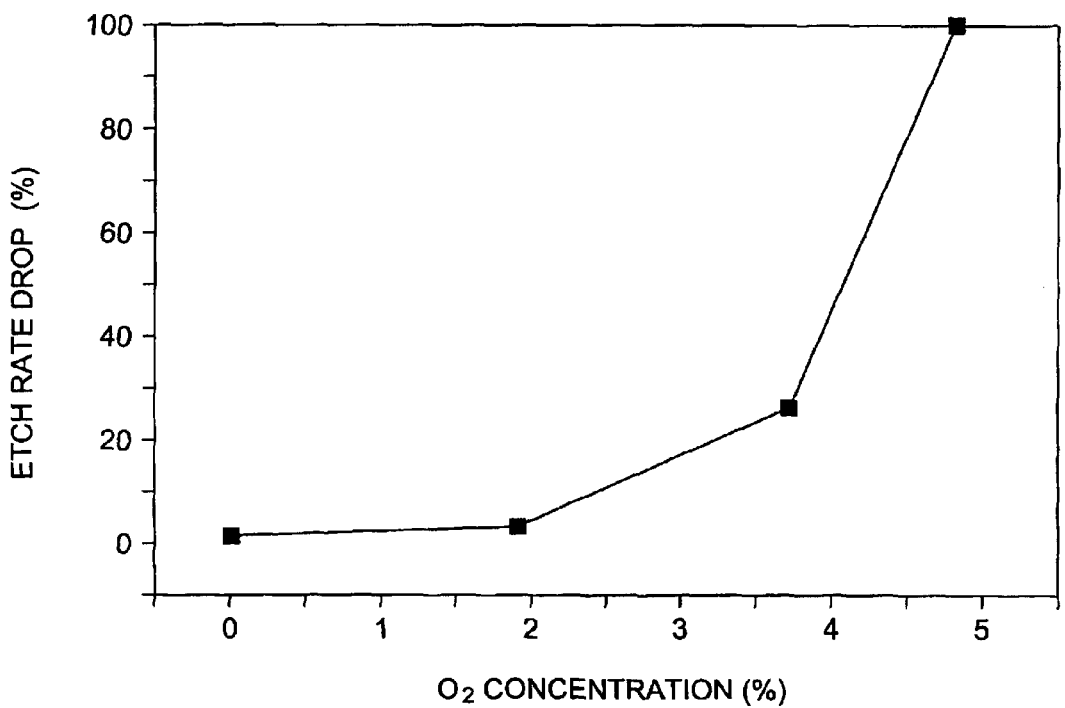
FIG. 5 is a graphical representation of an etch rate drop as a function of oxygen for HBr-based etching.
Figure 6:
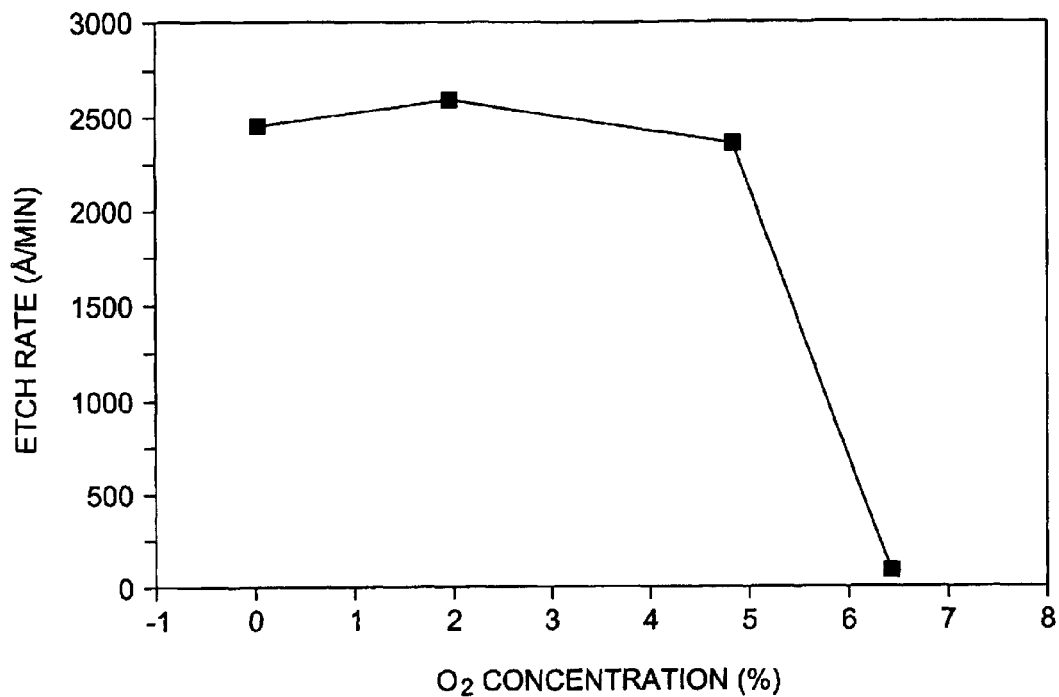
FIG. 6 is a graphical representation of an etch rate as a function of oxygen for HBr-based etching.
Figure 7:
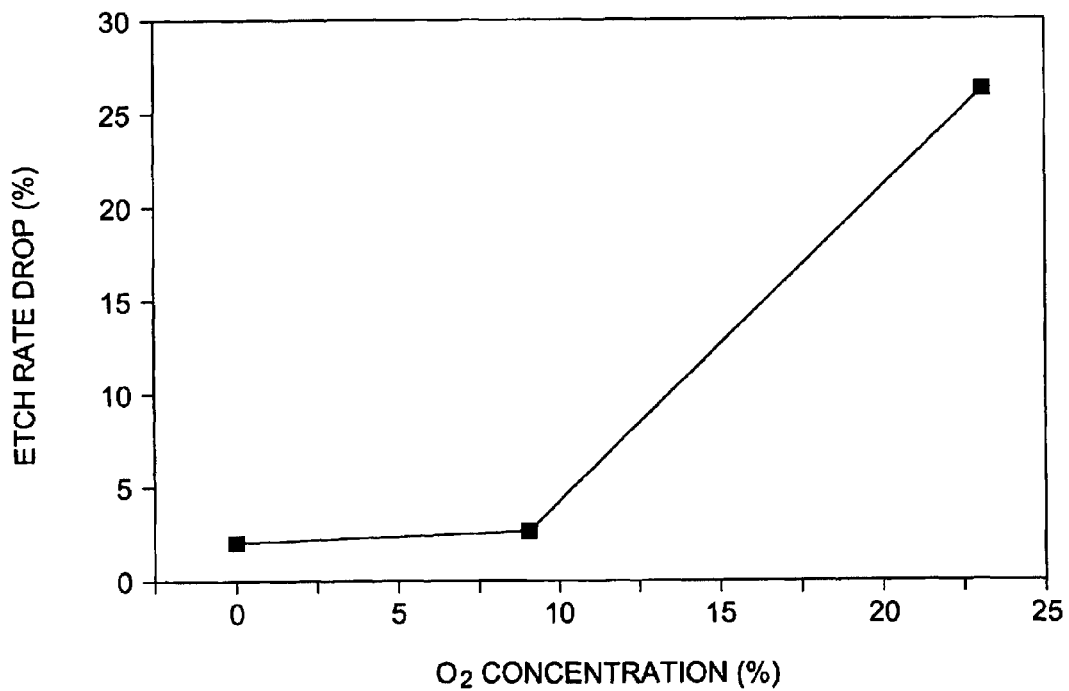
FIG. 7 is a graphical representation of an etch rate drop as a function of oxygen for $Cl_2$-based etching.
Figure 8:
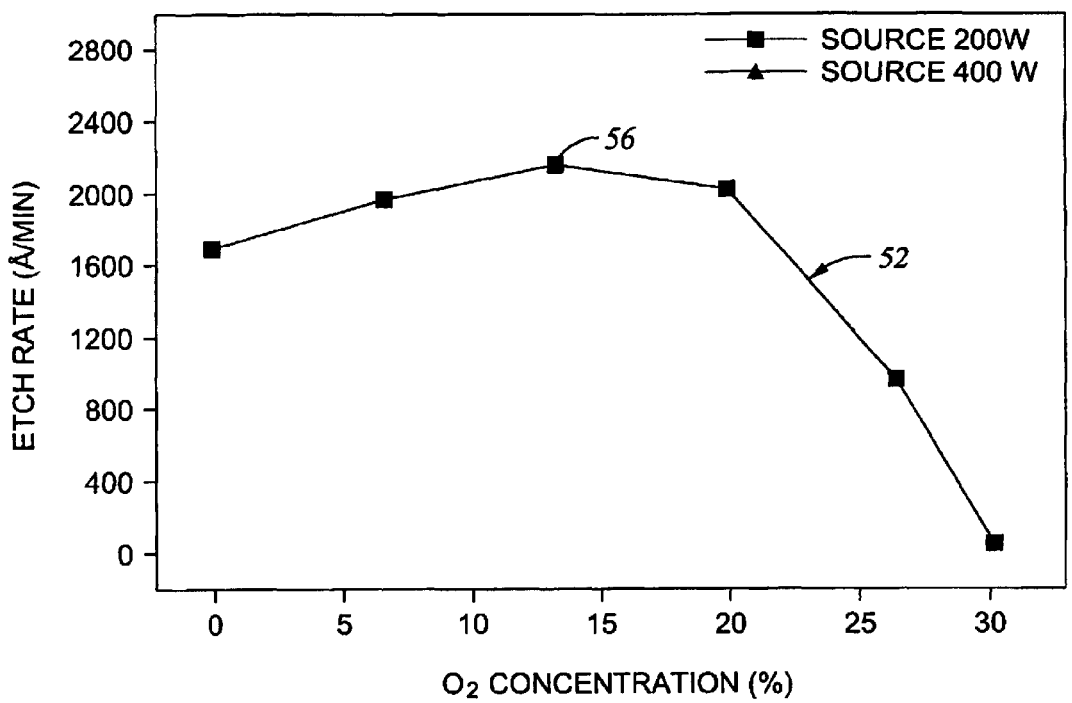
FIG. 8 is a graphical representation of an etch rate as a function of oxygen for $Cl_2$-based etching.

In another embodiment, the results of low pressure overetching are further improved by optimizing the concentrations of oxygen which is an etch chemistry additive used to achieve higher selectivity. FIGS. 5 and 6 show the overetch rate drop and the overetch rate, respectively, for HBr-based etching. FIGS. 7 and 8 show the overetch rate drop and the overetch rate, respectively, for $Cl_2$-based etching. Both HBr and $Cl_2$-based etching were detrimentally affected by increasing concentrations of oxygen due to surface oxidation of the substrate.

After a dry clean process, the concentrations of free radical etchants, e.g., Cl and Br, are decreased resulting in a proportionally higher concentration of oxygen. The oxygen oxidizes the substrate surface being etched, thereby inhibiting reactions between the etchants and the substrate surface. Consequently, the etch rates are decreased. While some oxygen is desirable to achieve greater selectivity, the oxygen concentration must be controlled to avoid a detrimental impact on the etch rate due to excessive oxidation of the substrate surface. As shown in FIGS. 5 and 7, the preferred oxygen concentration is also dependent on the etchant chemistry used. For HBr-based etching, shown in FIG. 6, the oxygen concentration is preferably between about 0% and 5%. For $Cl_2$-based etching, shown in FIG. 8, the oxygen concentration is preferably between about 0% and 15%.

Figure 9:
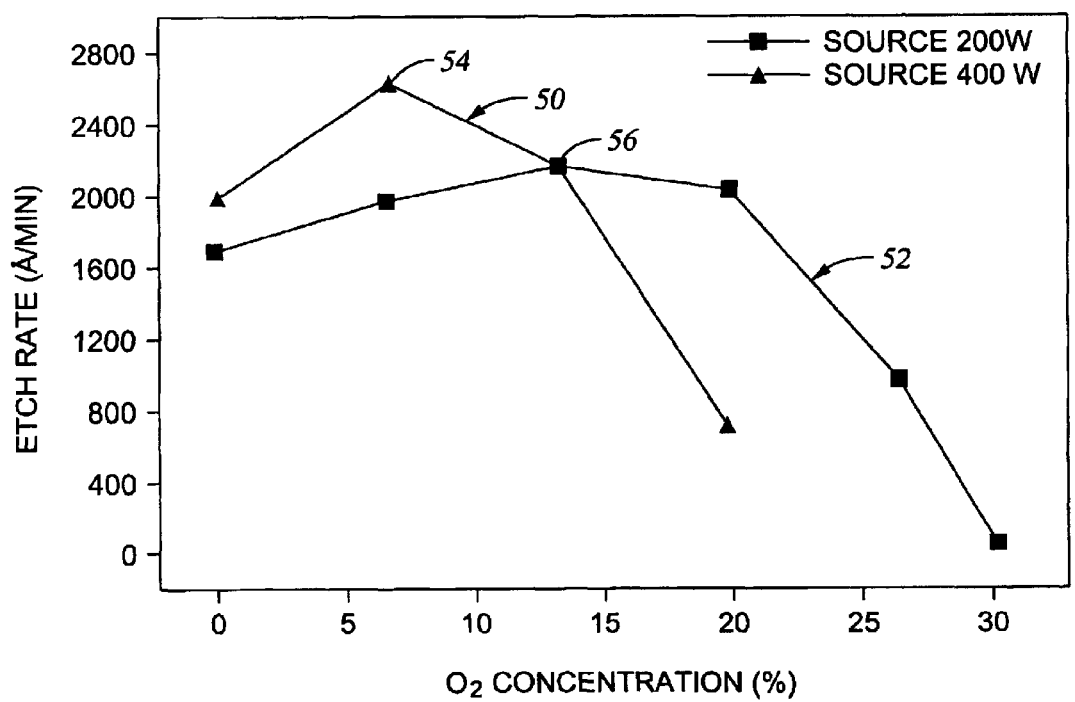
FIG. 9 shows graphical representations of etch rates as a function of oxygen at varies source power levels for $Cl_2$-based etching.

However, the optimal oxygen concentrations also vary according to other process parameters and must be adjusted accordingly. For example, the preferred oxygen concentration is dependent on the source power, i.e., the inductive coil power supplied to the inductive coil such as the coil 26 shown in FIG. 1. FIG. 9 shows two graphs for $Cl_2$-based etching where the $Cl_2$ flow rate is about 50sccm, the bias power to the support member is about 40W, and the chamber pressure is at about 3 mTorr. A first graph 50 plots the effects of oxygen concentration on the overetch rate at about 200W and a second graph 52 plots the effects of oxygen concentration on the overetch rate at about 400W. Graph 50 indicates a peak etch rate at an oxygen concentration of about 10% and a source power of about 400W. Graph 52 indicates a peak etch rate at an oxygen concentration of about 15% about and a source power of about 200W.

While both graphs exhibit decreasing etch rates with increasing oxygen concentration after critical points 54 and 56, graph 52 sustains a higher etch rate at higher concentrations of oxygen. Thus, at about 25% oxygen, graph 50 exhibits an etch rate of about 800 Å/min while graph 52 exhibits an etch rate of about 2000 Å/min. Thus, according to the invention, the oxygen concentrations and source power levels are adjusted to optimize the etch rate. Where higher oxygen levels are desirable, the source power levels are reduced to accommodate optimal etching rates. Conversely, where the lower oxygen levels are preferred, higher levels of source power may be used to achieve optimal etching rates. Although not shown in FIG. 9, HBr and other etchants exhibit similar responsiveness to changes in source power levels in the presence of oxygen.

Figure 10:
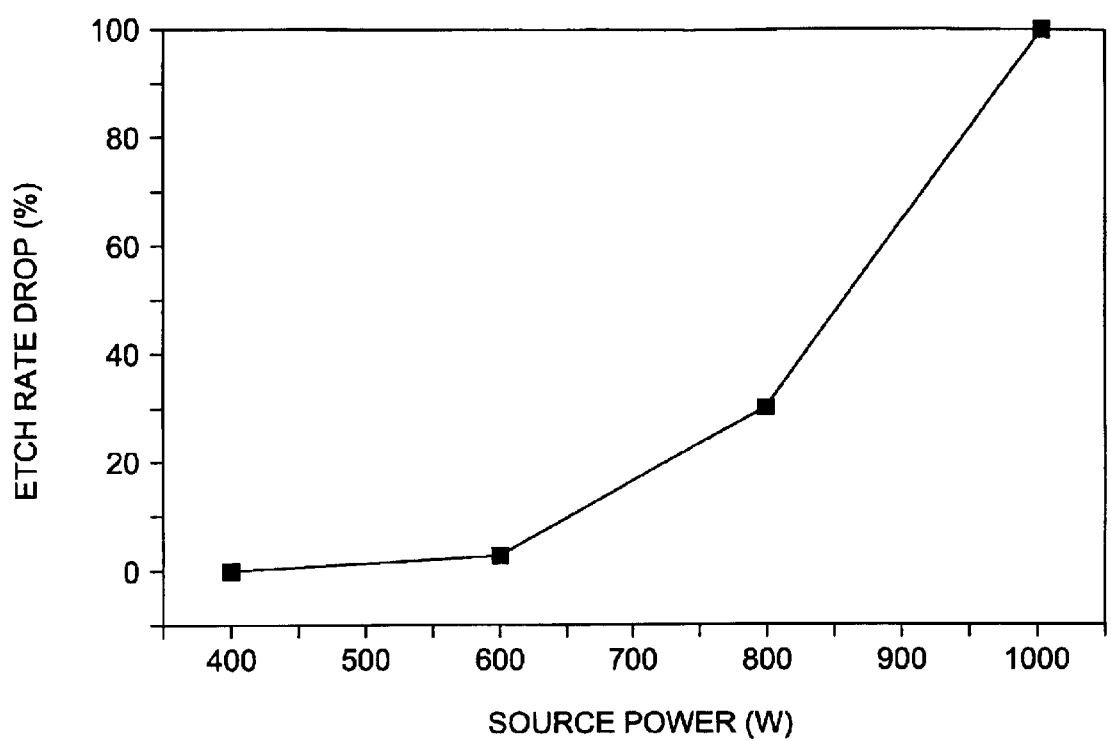
FIG. 10 is a graphical representation of an etch rate drop as a function of source power.

However, at an upper limit the source power causes an etch rate drop, as shown by the downward sloping portions of graphs 50 and 52 after the critical points 54 and 56. The etch rate drop is a result of accelerated surface oxidation at higher source power levels. FIG. 10 represents the etch rate drop for an HBr-based etch process having an oxygen concentration of about 4%. At about 600W of source power, the etch rate drop increases abruptly as a result of excessive surface oxidation on the substrate. Thus, the optimal processing recipe is achieved by controlling the level of oxygen and source power.

Two embodiments of a low pressure overetch process in the presence of oxygen are shown in Table III. In one embodiment, Cl-based chemistry is used. In another embodiment, Br-based chemistry is used.

TABLE III

| Parameter | Cl-based overetch | Br-based overetch |
|---|---|---|
| Composition: | $Cl_2$, $O_2$ (<15% by volume) | HBr, $O_2$ (<5% by volume) |
| Flow rate: | 50 sccm | 100 sccm |
| Coil Power: | 100–200 W | 300–500 W |
| Bias Power: | 30–50 W | 50–100 W |
| Pressure: | 3–5 mTorr | 10–30 mTorr |
| Temperature: | 0–10° C. | 30–50° C. |

While Table m shows only Cl-based chemistry and HBr-based chemistry for silicon etching, the invention contemplates other processes which are conventionally done in high pressure regimes and are sensitive to surface conditions. The optimal parameters for a given etch chemistry are determined according to the relationship between pressure, oxygen concentration, and source power as disclosed herein.

Another embodiment of the invention comprises the use of cleaning agents during etching. The term "cleaning agent" refers to highly volatile gases often used to clean chamber surfaces periodically. The present invention utilizes such gases to advantage during etch sequences. Thus, the cleaning agents provide a dual function of etching while also maintaining a clean chamber surface.

One cleaning gas which may be used to advantage during the main etch process is fluorine. Table IV and Table V provide preferred process recipes of the invention.

TABLE IV

| Parameter | Main Etch: Cl-based | |
|---|---|---|
| Composition: | Chlorine-containing etchant: | $Cl_2$; and |
| | Fluorine containing chemical: | $CF_4$ (<50% by volume), $SF_6$ (<20% by volume) or $NF_3$ (<20% by volume) |
| Flow rate: | 200 sccm | |
| Coil Power: | 300–500 W | |
| Bias Power: | 50–100 W | |
| Pressure: | 4 mTorr | |
| Temperature: | 30–50° C. | |

TABLE V

| Parameter | Main Etch: HBr-based and/or HCl-based | |
|---|---|---|
| Composition: | Etchant: | HBr and/or HCl; and |
| | Fluorine-containing chemical: | $SF_6$ (<20% by volume), $NF_3$ (<20% by volume), or $CF_4$ and $O_2$ (<50% by volume, where $CF_4:O_2 = 4:1$) |
| Flow rate: | 200 sccm | |
| Coil Power: | 300–500 W | |
| Bias Power: | 50–100 W | |
| Pressure: | 4 mTorr | |
| Temperature: | 30–50° C. | |

Table IV provides a preferred recipe using Cl-based etchant chemistry. Table V provides a preferred recipe using HCl and/or HBr-based etchant chemistry. Both recipes are main etch process recipes. The use of volatile cleaning agents according to the invention is well suited for main etch processes where the bulk of the material from device features is removed because of the high etch rate. The subsequent overetch process, which requires greater selectivity, may be performed according to any conventional recipe or a recipe of the invention and disclosed herein.

In operation, the internal chamber surfaces are exposed to a cleaning agent, such as a fluorine-based fluid, which reacts with byproducts formed during the main etch process and deposits formed on the chamber surfaces while also etching the desired areas of the substrate. The fluorine-based fluid and the byproducts form volatile compounds which are exhausted from the chamber. Thus, deposition on the chamber surfaces is minimized and the chamber surfaces maintain a substantially consistent composition. As a result of maintaining constant chamber surface conditions, the recombination of free radicals with deposits on the chamber surfaces is kept substantially constant over a longer period of time than is possible with conventional etching methods. Because the chambers do not require periodic cleaning, the up-time between cleaning cycles is increased to allow for improved productivity of the etching system.

While the addition of some fluorine-containing gases to processes producing substantial amounts of byproducts prevents the byproducts from depositing on chamber surfaces, a problem exists in cases where fluorine is the major etchant, such as in planarization and recess-etching. Fluorine is a highly corrosive etchant that attacks the chamber surfaces. Changes in the chamber surface can include the formation of a byproduct, due to corrosion, whereon free radicals exhibit a recombination rate different from the recombination rate on clean chamber surfaces. Additionally, chamber surface changes include changes in the texture of the internal chamber surfaces which can increase the exposed surface area, thereby providing increased recombination sites for free radicals. Over time, the chamber surfaces must be refinished, or in extreme cases, the chamber components, such as the body and dome, must be discarded and replaced. Otherwise, the etch result will change with the changing surface condition.

The inventors have discovered that the etch chemistry may be altered to reduce the corrosive effects of fluorine-based etching on chamber surfaces. In one embodiment, Cl is added to the etch chemistry. Table VI shows a preferred recipe of the present invention involving silicon etching.

TABLE VI

| Parameter | Main Etch for Silicon Etching | |
|---|---|---|
| Composition: | Chlorine-containing etchant: | $Cl_2$; and |
| | Fluorine-containing chemical: | $CF_4$, $SF_6$, $NF_3$ (<50% by volume) |
| Flow rate: | 200 sccm | |
| Coil Power: | 500–1000 W | |
| Bias Power: | 0–50 W | |
| Pressure: | 4–20 mTorr | |
| Temperature: | 50° C. | |

In general, a ratio of Cl to F, Cl:F, is preferably between about 1:2 to 2:1 and most preferably about 1:1. The addition of Cl to F-based chemistry is found to reduce to the corrosive impact of fluorine on chamber surfaces. Thus, the chamber condition is maintained substantially constant over a longer period of time than is possible using conventional recipes. As a result, the recombination rates of free radicals on the chamber surfaces are kept substantially constant during the processing of a substrate as well as from one substrate to the next.

In another embodiment of the invention, the chamber wall temperature is adjusted to reduce the deposition of byproducts on the chamber surfaces. Currently, the chamber wall temperature is maintained at about 60–80° C. The inventors have discovered that the deposition of byproducts on chamber surfaces decreases with increasing temperature. Therefore, the temperature can be controlled to reduce the amount of byproduct deposits on the chamber surfaces during processing. Preferably, the chamber wall temperature is higher than about 200° C. to minimize deposition buildup on the chamber surfaces, thereby preventing changes in the surface profile during processing.

In another embodiment of the invention, the etch chamber materials are selected to reduce the sensitivity of the etch process to changing surface conditions. As described above, one cause of etch rate fluctuation after a chamber cleaning cycle is the free radical recombination rates of etchants on varying surfaces. Thus, while the free radicals may have a first recombination rate on chamber surfaces comprising a first material such as aluminum or ceramic, the free radicals may have a second recombination rate on the process byproducts which are deposited on the chamber surfaces during processing. Over time, the chamber surface materials are covered by the byproduct deposits, thereby altering the surface composition exposed to the etchants and resulting in etch rate changes.

Conventionally, the effects of changing free radical recombination rates are minimized or eliminated by a seasoning cycle wherein a film comprising the byproducts formed during etching is deposited on the chamber to cover the chamber surface material. However, the seasoning cycle is time consuming and reduces the system throughput because production must be stopped.

The method and apparatus of the invention involves the selection of chamber materials according to the free radical recombination rates therewith. Preferably, the free radical recombination rates with the chamber material is substantially equal to the recombination rates with the byproduct deposition material which forms on the chamber surfaces over time. Thus, a substantially constant etch rate is maintained during changing chamber surface conditions. Preferably, the selected materials comprise at least 80% of the internal surface of the chamber.

In one embodiment, a poly etch chamber comprises an internal surface made of one or more materials such as quartz. However, the selected material is dependent on the etch chemistry. In each case, the material is selected to exhibit a free radical recombination rate thereon substantially equal to the recombination rate of the deposition which forms on the chamber. Referring to FIG. 1, the selected materials are preferably used to form the internal surfaces of the chamber body 12 and/or the chamber dome lid 13.

The foregoing embodiments were presented separately, in part, for clarity. However, the present invention contemplates the use of one or more of the embodiments described above in combination to optimize etching rates, repeatability and selectivity.

While foregoing is directed to the preferred embodiment of the present invention, other and further embodiments of the invention may be devised without departing from the basic scope thereof, and the scope thereof is determined by the claims that follow.

What is claimed is:

1. A method of etching a substrate in a chamber having internal surfaces, comprising:
   (a) flowing at least a first etchant and a second etchant into the chamber, wherein a volumetric flow of the first etchant is greater than a volumetric flow of the second etchant;
   (b) striking a plasma in the chamber to cause dissociation of the first etchant and the second etchant and etching of the substrate, wherein the dissociated first etchant deposits material on the internal surfaces at a first rate and the dissociated second etchant deposits material on the internal surfaces at a second rate less than the first rate; and
   (c) flowing oxygen into the chamber.

2. The method of claim 1, wherein the first etchant comprises chlorine and the second etchant comprises bromine.

3. A method of etching a substrate, comprising:
   (a) positioning a substrate in a chamber having internal surfaces;
   (b) flowing a chemical mixture into the chamber;
   (c) striking a plasma of the chemical mixture to form one or more plasma constituents;

(d) depositing a film on the internal surfaces; wherein a first recombination rate of the one or more plasma constituents with the internal surfaces is substantially equal to a second recombination rate of the one or more plasma constituents with the film; and (e) etching the substrate.

4. A method of etching a substrate, comprising:

(a) positioning a substrate in a chamber having internal surfaces;

(b) flowing a chemical mixture into the chamber;

(c) striking a plasma in the chamber from the chemical mixture to form one or more plasma constituents, (d) depositing a film on the internal surfaces, wherein a first recombination rate of the one or more plasma constituents with the internal surfaces is substantially equal to a second recombination rate of the one or more plasma constituents with the film; and (e) etching the substrate, wherein the substrate comprises polysilicon and wherein the internal surfaces substantially comprises quartz.

5. The method of claim 4, wherein the internal surfaces comprise a liner disposed on a chamber body.

6. The method of claim 3, wherein the one or more plasma constituents comprises chlorine, hydrogen chloride, and combinations thereof.

7. The method of claim 4, wherein the one or more plasma constituents comprises bromine, hydrogen bromide, end combinations thereof.

* * * * *

UNITED STATES PATENT AND TRADEMARK OFFICE
CERTIFICATE OF CORRECTION

PATENT NO. : 6,808,647 B1  Page 1 of 1
APPLICATION NO. : 09/352008
DATED : October 26, 2004
INVENTOR(S) : Songlin Xu et al.

It is certified that error appears in the above-identified patent and that said Letters Patent is hereby corrected as shown below:

Title Page

Add Assignee: Applied Materials, Inc., P.O. Box 450-A, Santa Clara, CA 95052

Column 2
Line 38: Insert a period before " The"

Column 6
Line 25: Insert a period after "27"
Line 61: Change "ething" to --etching--

Column 8
Line 6 should read: --Flow rate: 200 sccm 155-160 sccm--

Column 9
Table II: Change "(1 Cl:2 Br)" to --(4 Cl:1 Br)--

Column 10
Line 2: Change the first occurrence of "100W" to --1000W--

Column 11
Line 23: After "15%", delete "about"
Line 66: Change "Table m" to --Table III--

Signed and Sealed this

Twenty-seventh Day of February, 2007

JON W. DUDAS
*Director of the United States Patent and Trademark Office*